US005486113A

United States Patent [19]
Lundh

[11] Patent Number: 5,486,113
[45] Date of Patent: Jan. 23, 1996

[54] DEVICE FOR CONNECTING A CIRCUIT BOARD TO A CONNECTOR PLANE

[75] Inventor: Peter C. B. Lundh, Farsta, Sweden

[73] Assignee: Telefonaktiebolaget LM Ericsson, Stockholm, Sweden

[21] Appl. No.: 216,956

[22] Filed: Mar. 24, 1994

[30] Foreign Application Priority Data

Mar. 25, 1993 [SE] Sweden .................. 9300997

[51] Int. Cl.⁶ ................................. H05K 7/00
[52] U.S. Cl. ............................. 439/61; 361/785
[58] Field of Search ............... 439/61, 64; 361/785, 361/788, 796, 797

[56] References Cited

U.S. PATENT DOCUMENTS

| | | | |
|---|---|---|---|
| 4,179,172 | 12/1979 | Godsey et al. | 361/785 |
| 4,420,793 | 12/1983 | Strandberg | 439/61 |
| 4,511,950 | 8/1985 | Bunner et al. | 361/788 |
| 4,723,115 | 2/1988 | Apter | 439/620 |
| 4,903,170 | 2/1990 | Finney et al. | 361/818 |
| 5,325,270 | 6/1994 | Wenger et al. | 361/797 |

FOREIGN PATENT DOCUMENTS

| | | |
|---|---|---|
| 0188965 | 7/1986 | European Pat. Off. . |
| 2214503 | 10/1973 | Germany . |
| 3208991 | 9/1983 | Germany . |

Primary Examiner—Neil Abrams
Attorney, Agent, or Firm—Burns, Doane, Swecker & Mathis

[57] ABSTRACT

For connecting external wiring to a circuit board (1), which is inserted in a housing arrangement (7), there is conventional backpanel (13) having connector elements (15) for receiving corresponding connector elements (3) on the circuit board. The external wiring is connected to contacts (29) on an exchangeable and removable connector unit (21). The unit is inserted in the housing in a similar way as a circuit board but is not connected to the backpanel (13) and comprises connector contacts (27) for connection with corresponding connectors (5) on the circuit board (1). When the circuit board (1) is inserted into the housing (7) thus electrical contact is obtained both with the contacts (15) on the backpanel (13) and with the contacts (27) on the wiring connector unit (21). From the contacts (27) on the connector unit (21) leads extend to the various contact pins (29), which are located easily accessible from the front of the housing (7).

28 Claims, 4 Drawing Sheets

DEVICE FOR CONNECTING A CIRCUIT BOARD TO A CONNECTOR PLANE

BACKGROUND

The present invention is related to a device for connecting a circuit or component board, provided with various electronic components, to a connection plane or back plane and in particular to a connector unit for facilitating the electrical connection of the circuit board.

In a housing or casing for electronic circuits, which is intended for e.g. small nodes in telecommunication networks, normally several various electronic circuit boards are arranged and connected. There are for these circuit boards different requirements on the manner how they should be connected to other, in particular to exterior or extra added units, i.e. on the configuration of their external wiring. In order that it will be possible to use such a housing also for such external or extra connections used in the future, it would be advantageous, if the housing and in particular the interior construction thereof could be configured in a suitable way allowing various solutions of the structure of the external wiring without any fundamental reconstruction of the structure of the housing.

It is for example desired that it will be possible to avoid external wiring at the front or top edge and at the other two, not connected edges of a circuit board, since, for a circuit board having connector means to external wires located at the free edges, those persons which are to handle a replacement of the circuit boards, must have knowledge of and be able to handle this particular wiring and the various connections thereof.

It is also generally desired that it will be possible to access the different external wires from the front or the open side of the housing. It will make it necessary to open the housing only at one side for insertion and connection of for instance a new circuit board. Then for instance two housings or casings for circuit boards can be built into cabinets where the rear sides of the housings face each other, since for such an arrangement it will not be necessary to access the spaces at the rear sides of the housings.

In the German patent document DE-C2 32 08 991 a housing arrangement is disclosed which has the general structure for which the invention is suited. The external wiring is here located in a space or room behind the backpanel and has contact means located and accessible outside the circuit board housing itself, at one side thereof. Also in the U.S. Pat. No. 4,903,170 a housing arrangement is disclosed, wherein the external wiring is arranged in a space behind the back plane. The external wires are not accessible from the front of the housing.

In the published European patent application EP-A1 0 188 965 a circuit board housing is disclosed having external wiring accessible from the front but outside, on the top of the housing.

Further, from the U.S. Pat. No. 4,511,950 a backpanel for circuit boards is previously known, in which the power distribution to the individual circuit boards is provided by means of separate, smaller circuit boards arranged in the same plane as the circuit boards and having connectors aligned with the connectors of the circuit boards.

In the U.S. Pat. No. 4,420,793 a connection assembly or backpanel is disclosed having the connectors for each component board interrupted such that a line or row of contact connectors is divided into two separate groups.

SUMMARY

It is a purpose of the invention to provide a housing arrangement and circuit boards allowing a simple connection of external wiring to different types of circuit boards.

It is a another purpose of the invention to provide a housing arrangement and circuit boards allowing arbitrary wire connections to each type of circuit boards, in particular allowing that circuit boards having different structures can be connected simultaneously in the housing.

It is another purpose to provide a housing arrangement and circuit boards making it possible to avoid external wiring at the front or top edge and at the other two, not connected edges of a circuit board.

It is another purpose to provide a housing arrangement and circuit boards allowing access to the different external wires from the front of the housing arrangement.

It is another purpose to provide a housing arrangement and circuit boards allowing that housings can be built into cabinets having the rear side of the housings facing each other.

The purposes mentioned above are accomplished by the invention by providing a device for connection of circuit boards and in particular a housing arrangement including such a connection device and also a connector unit for use in the device.

In order to provide circuit boards with connections to external cables, i.e. different kinds of unfixed or unattached wires, it is thus arranged, such that the circuit board, when being inserted in a housing or subrack of the conventional type, will contact both conventional connector elements, such as connector sockets on a backpanel, here generally called a connection panel, and other connector elements, which can also be connector sockets of a conventional type, but located on a replaceable and detachable wiring connector unit and arranged at the same edge of the circuit board, where the other connector elements are located. The detachable connector unit is suitably itself a circuit board which in the general case is smaller than the first mentioned circuit boards and it has at its surface or comprises generally leads between the contact elements for connection to the circuit boards and contact terminals, where the unfixed or loose wires can be adapted. These other connector terminals or connection pins can then, with a suitable design of the wiring connector unit and the housing be arranged such that they will be accessible from the same side from which the circuit board is inserted.

The connector elements at the backpanel is in the conventional way arranged substantially linearly in one or several rows for each circuit board to be connected to the backpanel and these rows are then parallel to rows of the connector contacts located on the wiring connector unit for contact with the circuit board. These connector elements on the backpanel and the connector unit can then be substantially aligned with each other or the connector contacts of the wiring connector unit for connection to the circuit board may be displaced in front of the rows of connector contacts located on the backpanel.

The connection panel is in the conventional way provided with connector sockets for several circuit boards, which are located in parallel, adjacent to each other and side by side and which are all inserted from the same side or in the same direction, here called from the front of the panel and the housing. The connection panel comprises leads between its different connector contacts for connection to the circuit boards and may, when it is necessary, also leads to other exterior devices, for instance a power supply unit. In addition to the connector contacts of a circuit board which are intended for electrical contact with the corresponding connector elements on the connection panel, also other connector terminals may be arranged on a circuit board, which are intended for the transfer of various signals between the circuit board and other devices, these signals then being able to pass in various unfixed or loose cables or wires.

The wiring connector unit has a body which has a generally rectangular shape as seen from the side thereof. It has sides, front edge surfaces and Lateral edges and a rear edge. There are first and second connector contacts are located on the front edge surfaces for connection to the second connector contacts of a circuit board and for connection to wires or cables respectively. Electrical leads, suitably arranged, connect the connector contacts of the unit. The leads between the first and second connector contacts on the unit may comprise interface means, in particular filters, voltage conversion circuits, modulation and demodulation circuits.

The second connector contacts of the connector unit are located on a front edge surface which is substantially parallel to the front edge surface where the first connector contacts of the unit are located. There is advantageously a recess at one corner of the rectangular shape of the wiring connector unit producing a front edge surface in the recess, where the first connector contacts of the wiring connector unit are located. At the corner formed by the recess a locking device in the shape of an articulated arm is arranged for keeping the unit in a fixed position when it is in the inserted position in the housing.

BRIEF DESCRIPTION OF THE DRAWINGS

In the following the invention will be described in more detail with reference to an exemplary embodiment which is intended not to restrict the invention and which is illustrated in the accompanying drawings, in which, FIG. 1 schematically shows a circuit board having a simple connection of the external wiring, FIG. 2 schematically shows, as viewed from the side, a housing arrangement together with an inserted circuit board and connector unit, FIG. 3 schematically shows the housing as seen from the front thereof with inserted connector units and one inserted circuit board, FIG. 4 schematically shows an alternative embodiment of a circuit board.

DETAILED DESCRIPTION

Figure 1:
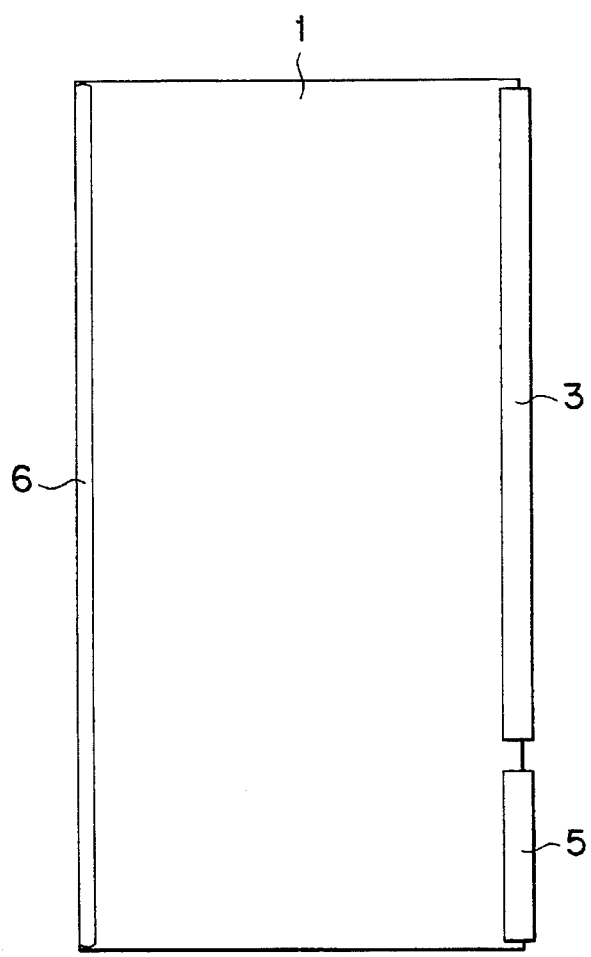

In FIG. 1 a circuit board 1 is schematically shown as seen from the side illustrating a large surface thereof. It can be a conventional printed circuit board or pattern board (PCB) having electric conductor paths printed thereon and electronic and other components arranged thereon, not shown. The circuit board 1 has a generally rectangular outline and is at one of its edges, a rear edge, provided with a first group of connectors 3 comprising contacts for power distribution and for communication with other circuit boards, which are not shown in this Figure but are arranged in parallel and side by side in the conventional way in a common casing or housing arrangement, and a second group of connectors 5 for communication, by means of exterior wires or cables, with accessory units and also for contacting extra unfixed and loose wire leads or cables between the different circuit boards in the same housing.

The connector contacts in each group are located contiguously along a line, one connector group thus being located at an upper portion of the edge and the other connector group at a lower portion of the same edge of the circuit board 1.

At the opposite edge of the circuit board 1, the front edge, a board front 6 is arranged in the shape of a rim having EMC protection means attached thereto.

Figure 2:
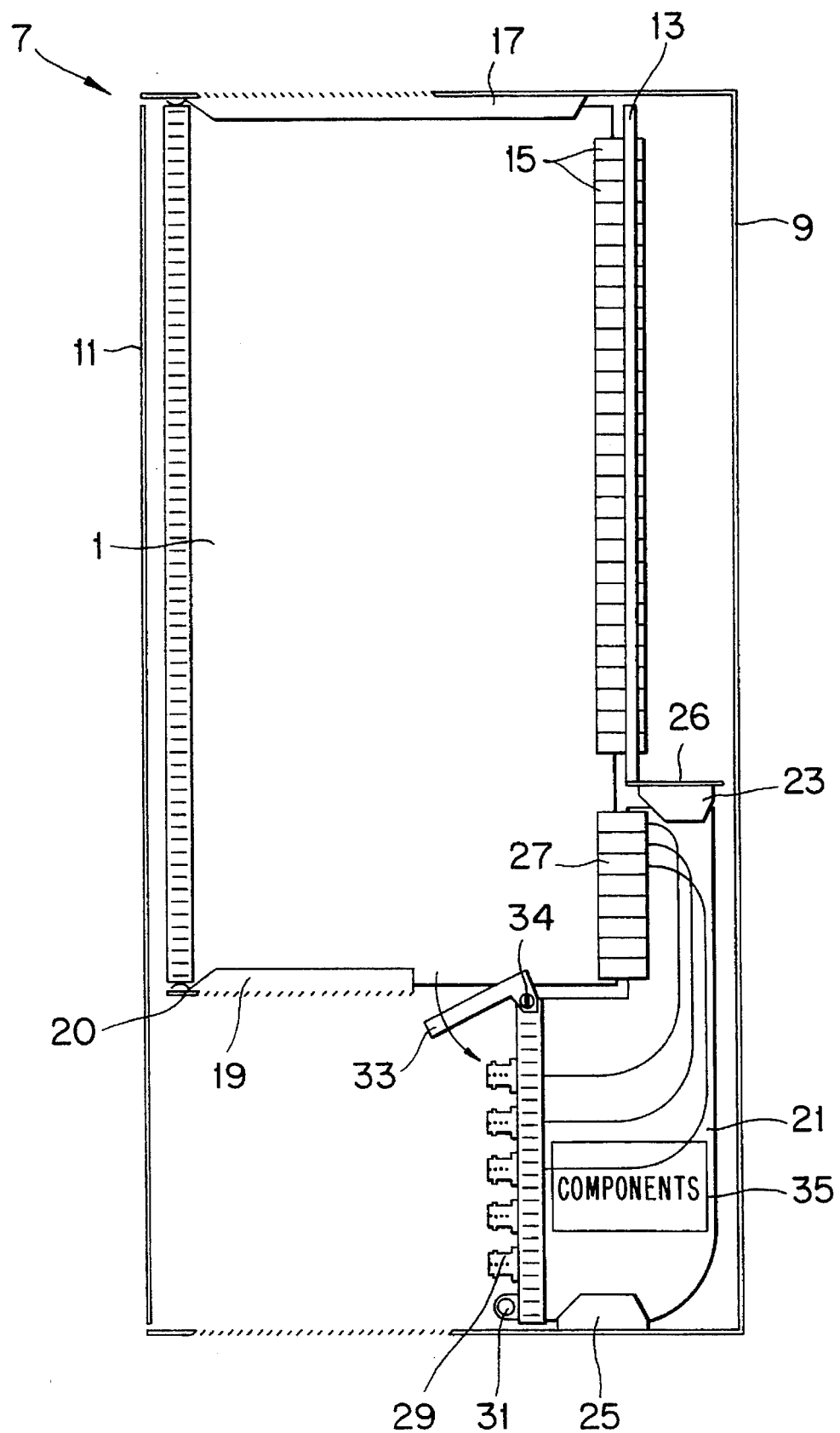

In FIG. 2 a circuit board 1 is shown, as seen from the side and installed in a housing arrangement 7, of which portions of a casing or housing part 9 which is open at the front and a front piece or lid 11 are visible in a cross-section. The parts 9 and 11 of the housing arrangement 7 is in the common way made of electrically shielding material, e.g. metal plates. The circuit board 1 is electrically connected to a connection board or backpanel 13, which is rigidly mounted in the housing adjacent to a rear side thereof by means of some retaining means, not shown. The backpanel 13 comprises connectors, indicated at 15, which cooperate with the corresponding connector contacts in the first contact group, as shown at 3 in FIG. 1, on the circuit board 1 inserted in the housing arrangement 7. The backpanel 13 can in the conventional way be a printed circuit board, comprising connection lines or leads, not shown, between its contact elements 15.

In order to place a circuit board 1 in the housing arrangement 7 the housing front or lid 11 is removed and the circuit board 1 is inserted, guided by upper and lower guide rails 17 and 19 respectively, which are rigidly mounted in the housing part 9 of the housing arrangement 7. In the illustrated embodiment the guide rails 17 and 19 start in the neighbourhood of the front side of the housing arrangement 7, that is near the lid 11, and extend to suitable positions inside the housing in a direction towards the rear side of the housing arrangement 7. The upper guide rail 17 can be attached to the inner surface of the top side or wall of the housing part 9 and the lower guide rail 19 to a transversal horizontal partition wall 20, mounted in a suitable way in the housing part 9. In the insertion of the circuit board 1 the rear edge of the circuit board 1 carrying the connector elements 3 in the first group will be engaged with the connector contacts 15 on the backpanel 13.

In order to also connect the other connector contacts 5 in the second group on the circuit board 1, which as shown in FIG. 1 are located at the lower part of the rear edge of the circuit board, a replaceable and detachable wiring connector unit 21 is inserted in the housing 7. It is mounted in the casing part 9 of the housing arrangement 7 before installing the circuit board 1, by inserting the wiring connector unit 21 from the front side of the open casing part 9 at the lower compartment thereof below the partition wall 20 and below the lower guides 19 for the circuit boards 1.

The wiring connector part 21 has in the embodiment shown a vertical length or height corresponding to the height of the room in the casing 9 below the partition wall 20 increased by the total length of all connections 5 in the second group which are located at the lower portion of the rear edge of a circuit board 1. In the insertion movement of the wiring connector unit to its position inside the housing, it must thus have an angular orientation different from the angular position, which it will finally have when installed in the housing arrangement 7. The lower guides 19 for the circuit boards and the partition wall 29 do not extend the whole length from the front edge of an inserted board to its rear edge but start close to the front part 11 of the housing arrangement 7, and extend only some distance towards the rear side of the housing arrangement 7. In this way an opening is obtained in the partition wall 19 at the inner portion thereof, through which the wiring connector unit 21 can be inserted upwards to a position just in front of relatively short upper and lower guide rails 23 and 25 respectively. The upper guide rails 23 are mounted on a short transversal horizontal partition wall 26 extending from the lower edge of the generally vertical backpanel 13 towards the rear side of the housing arrangement 7. The lower guide rails 25 are attached to the bottom side of the casing portion 9 of the housing arrangement 7. Thereafter the upper and lower sides of the wiring connector unit 21 can be inserted in the respective guide rails 23, 25 and the connector unit 21 be pushed to is correct position, e.g. having its rear edge extending in parallel to and adjacent to the rear surface of the housing 7.

In order to facilitate the insertion of the wiring connector unit 21 in the guides 23 and 25 intended therefor, the inner, rear and lower corner of the wiring connector unit 21 can be rounded or bevelled. Then the wiring connector unit 21 can be first inserted in its upper guide rails 23 in a position where the whole lower part of the wiring connector unit 21 is swung out, farther away from the rear side of the housing 7 than the top part. Thereafter the wiring connector unit 21 is turned to a correct angular position with its rear edge vertical and in this movement the lower edge thereof will enter the lower guide rails 25.

At the top part of the wiring connector unit 21 which at its front side is indented in relation to the lower portion of the front side of the connector unit 21, there is thus connector contacts 27 for engagement with the corresponding connectors 5 on the circuit board 1. These connectors 27 on the wiring connector unit 21 will in the illustrated configuration be aligned with the connector contacts 25 on the back plane 13 when the wiring connector unit 21 is correctly installed in the housing arrangement 7.

The lower portion of the wiring connector unit 21 has a vertical front edge or side which is located, in the inserted position of the unit 21, more close to the front of the housing arrangement 7 than the connector contacts 15 on the backpanel 13. At this front side or front surface of the lower portion of the unit 21 there are various connector contacts or terminals, indicated at 29, for connection to various unfixed or loose wires or cables (not shown). They may be for instance coaxial wires, optical fibres, exterior accessory cables between various circuit boards in the same housing 7, etc.

On the front surface, near the bottom side of the wiring connector unit 21 also a pull eye 31 is arranged and it can be used for pulling the wiring connector unit 21 from its installed position in the housing 7, for instance for a repair or a replacement of the unit 21.

The shape of the wiring connector unit 21, as seen from the side of the housing arrangement 7 and looking at the large surfaces of the unit 21, can thus be described as being generally rectangular with a height corresponding to twice or more the depth or horizontal length or the unit 21. In the rectangular basic shape as seen from the side, the top front corner is removed, thus producing the indentation of the row of connectors 27 as mentioned above, and the rear lower corner of the unit 21 is rounded.

A locking arm 33 is articulated at a point 34 located at the front surface of the wiring connector unit 21 for locking the wiring connector unit 21 in its position inserted in the housing arrangement 7. The point 34 is located at the outgoing corner produced by the recess in the top front of the unit 21. For a locking operation the locking arm 33 is swung in a plane parallel to the large lateral surfaces of the unit 21 and turned from an angular position near the front surface of the connector unit 21 until the end of the locking arm 33, which is remote from the articulating point 34, comes into contact with the rear inner end of the lower guides 19 for the circuit board 1. In the locked position the arm 33 will thus extend horizontally to be aligned with the partition wall 20 and form a parallel continuation thereof. The locking arm 33 can be entirely or partly made of a conducting material, such that in its locked position it will electromagnetically shield the lower compartment accommodating the connectors of the wiring connector unit 21 from the room where the circuit boards 1 are installed.

The wiring connector unit 21 may of course, like the backpanel 13, comprise various interior connection lines communicating between the contact elements 27 for connection to the circuit boards and the connector contacts 29 for connection to the wires. At or inside the unit 21 also components such as filters, adaptors, interference suppression devices, etc. 35 may be arranged if there is space enough.

Figure 3:
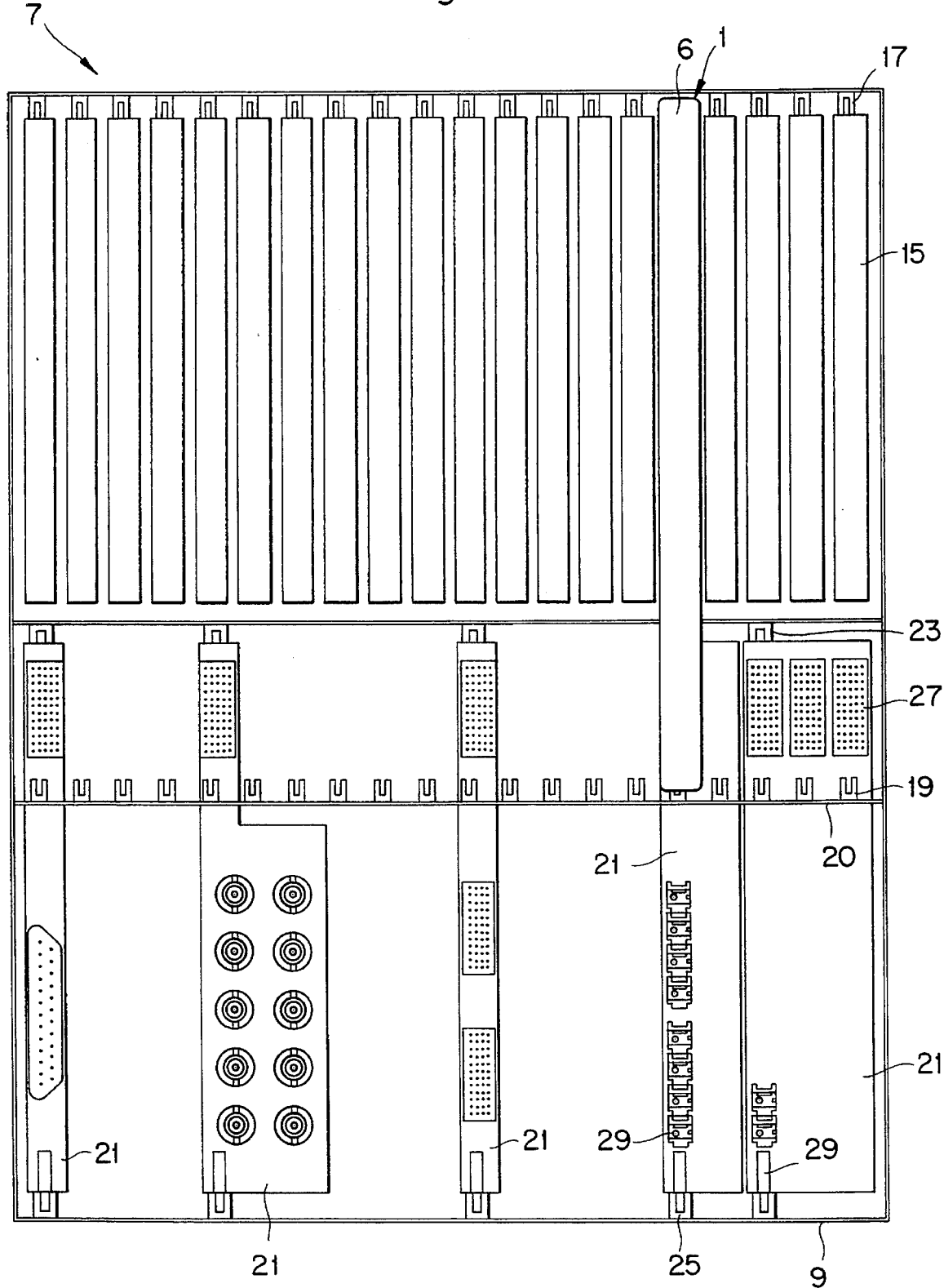

In FIG. 3 the housing arrangement 7 is shown as seen from the front with the front plate 11 removed. The board front 6 of one circuit board 1 inserted in the housing 7 is visible. At the lower part of the housing arrangement 7 various terminal configurations of the wiring connector units 21 are shown. The wiring connector units 21 can in the simplest case be constructed for a single circuit board 1, such as illustrated at the leftmost side and in the middle of the drawing. Rightmost a wiring connector unit 21 is shown, referenced "CC", which has connectors 27 for three different circuit boards 1, not shown, intended to be located adjacent to each other. This connector unit, having the width of three component boards 1, comprises interconnections between the three boards to be connected to the unit "CC". In addition this unit CC has connection terminals to exterior unfixed wires. Further, when it is required and if there is space enough in the housing 7, the upper portion of a wiring connector unit 21 can be designed for the connection to a single circuit board 1 and the lower part thereof being wider corresponding to the total width of for instance three adjacent circuit boards 1, such as illustrated for the wiring connector unit 21 located next to the leftmost position in the drawing.

Figure 4:
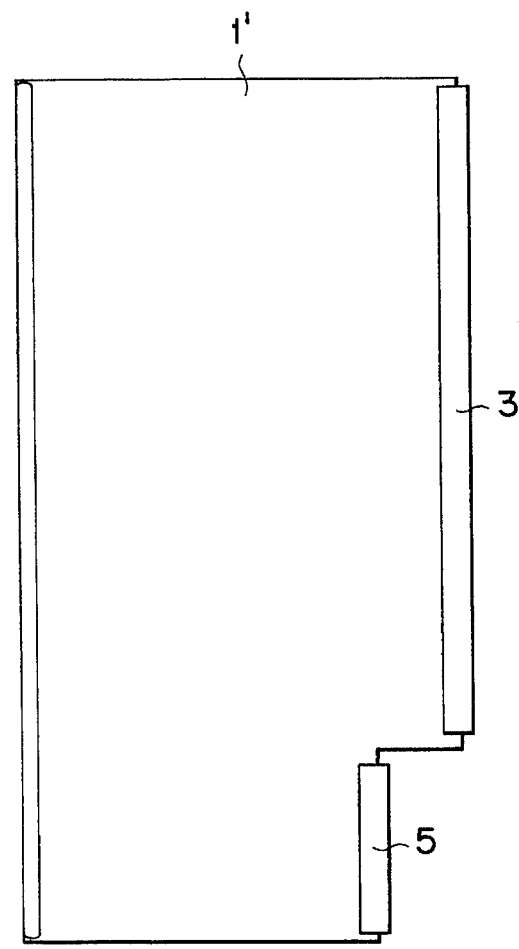

Another embodiment of a circuit board 1' is shown in FIG. 4, where the board 1' at its rear lower corner exhibits a rectangular recess, the connector elements 5 in the second group being mounted at the vertical side thereof. This will mean that the recess must have a vertical length or height corresponding to at least the total length of the row of the connectors 5 in the second group. These connectors 5 are thus located in a row or a line which is parallel to the first group connectors 3 of the circuit board 1' intended for connection to the backpanel 13 but which is displaced laterally towards the inner portion of the board 1', that is towards the front edge of the circuit board 1'.

Figure 5:
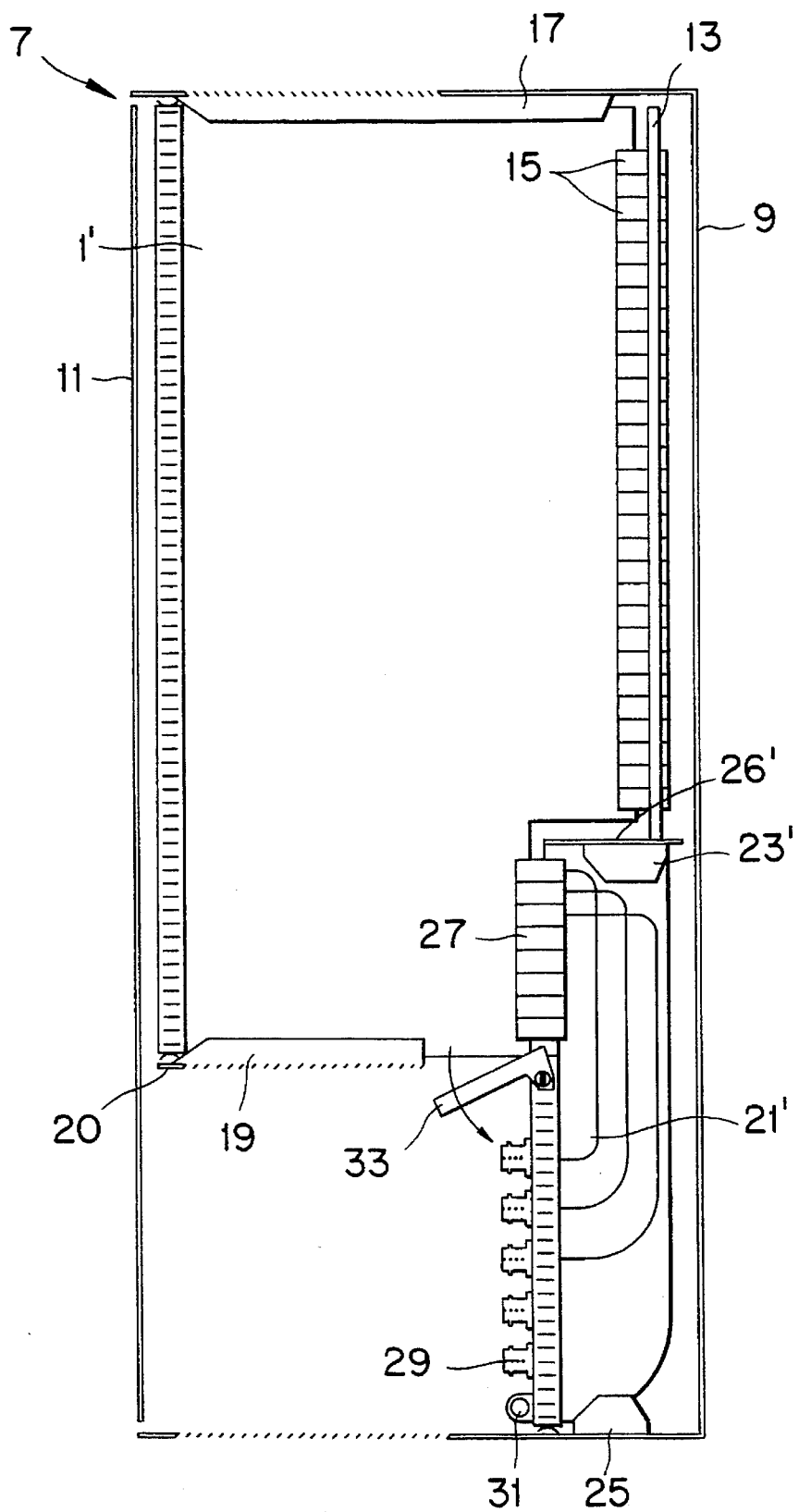
FIG. 5 shows in the same view as FIG. 2 a housing adapted to the circuit board of FIG. 4.

In this case the shape of the wiring connector unit 21' must be modified accordingly, as is illustrated in FIG. 5, such that the contact connectors 27 on the connector unit 21' intended for connection to the circuit cards 1' are located in a line which is parallel to a line through the connector contacts 15 of the backpanel 13 but is displaced a corresponding distance towards the front of the housing 7. As is illustrated in FIG. 5 the modified connector unit 21' will then, with a suitable dimensioning of the recess of the circuit board 1', have a substantially rectangular shape as viewed from the side without the recess or indentation in the embodiment according to FIG. 2. An advantage with the design of a circuit board 1' according to FIG. 4 is that the space behind the backpanel 13 at the rear side of the housing 9 can be made smaller.

The small partition wall 26' at the lower side of the backpanel 13 will in this case extend also to the front side of the housing 7 in order to support the upper guides 23' for the connector unit 21'. The Locking arm 33 will be articulated at a point between the connector elements 27 and the wiring connector terminals on the connector unit 21'.

What is claimed is:

1. A device for connecting a circuit board to a connection panel, the connection panel having panel connector contacts for connecting the panel to a plurality of circuit boards and each circuit board comprising first connector contacts for connecting to the panel connector contacts, the first connector contacts disposed such that the circuit board is displaced in a direction towards the connection panel for connection thereto; and second connector contacts for transferring signals between the circuit board and external devices, the device comprising:

a wiring connector unit having a generally rectangular shape comprising a front edge having a surface, an opposite rear edge, a top edge facing the first connector contacts and an opposite bottom edge and including:

third connector contacts located at the front edge surface for connecting to the second connector contacts, the third connector contacts engaging the second connector contacts when the circuit board is connected to the connection panel;

fourth connector contacts locate at the front edge surface for connection to the external devices, the fourth connector contacts electrically connected to the third connector contacts; and guides for cooperating with the top and bottom edges of the wiring connector unit to cause the wiring connector unit to be displaced in generally the same direction as the circuit board for connection thereto.

2. The device of claim 1, wherein the third connector contacts are located along a line in parallel to the front edge surface where the fourth connector contacts are located.

3. The device of claim 1, wherein one corner of the generally rectangular shape has a recess such that the third connector contacts are located along a line displaced in parallel to the front edge surface where the fourth connector contacts are located.

4. The device of claim 1, wherein the third connector contacts and the panel connector contacts are arranged in substantially parallel rows.

5. The device of claim 1, wherein the third connector contacts and the panel connector contacts are arranged in substantially continuous rows.

6. The device of claim 1, wherein the wiring connector unit further comprises fifth connector contacts for connecting to conductors which extend to other circuit boards connected to the connection panel.

7. The device of claim 1, wherein the wiring connector unit further comprises sixth connector contacts tier connecting to another circuit board which is connected to the connection panel; the other circuit board having:

first connector contacts for connecting with the connector contacts on the connection panel, the first connector contacts being connected by displacing the other circuit board in same direction towards the connection panel, and second connector contacts for transferring signals between the other circuit board and external devices and/or for supplying power; and the sixth connector contacts are located in such a way that they engage with the second connector contacts on the other circuit board when the other circuit board is displaced in said direction towards the connection panel for connection to the connection panel.

8. The device of claim 1, wherein the first and second connector contacts of the circuit board are arranged along an edge thereof.

9. The device of claim 1, wherein the first and second connector contacts are arranged in substantially parallel rows.

10. The device of claim 1, wherein the first and second connector contacts are arranged in substantially continuous rows.

11. The device of claim 1, wherein the wiring connector unit further comprises a locking device for keeping the wiring connector unit in a position where it will be connected to a circuit board when the circuit board is inserted into the connection panel.

12. The device of claim 1, wherein the direction towards the connection panel, in which the circuit board is displaced when connected to the connection panel, is substantially perpendicular to a large surface of the connection panel.

13. The device of claim 1, wherein the third and fourth connector contacts are electrically connected through one or more of the following elements: filters, voltage conversion circuits, modulation circuits, and demodulation circuits.

14. The device of claim 1, wherein the wiring connector unit includes a bevelled edge.

15. A housing arrangement for housing a plurality of circuit boards, comprising:

a connection panel having electrically connected panel connector contacts for connecting the panel to a plurality of circuit boards, each circuit board having first connector contacts for connecting to the panel connector contacts, the first connector contacts disposed such that the circuit board is displaced in a direction towards the connection panel for connection thereto, and second connector contacts;

a wiring connector unit having a generally rectangular shape, including a front edge having a surface, an opposite rear edge, a top edge facing the first connector contacts and an opposite bottom edge, the wiring connector unit having third connector contacts located at the front edge surface for connection to the second connector contacts, the third connector contacts engaging the second connector contacts when the circuit board is connected to the connection panel, and having fourth connector contacts for connection to external devices, the fourth connector contacts electrically connected to the third connector contacts; and guides attached to walls of the housing arrangement, the guides cooperating with the top and bottom edges of the wiring connector unit to cause the wiring connector unit to be displaced in generally the same direction as the circuit board for connection thereto.

16. The housing arrangement of claim 15, further comprising a partition wall located at one edge of a backpanel of the housing arrangement, wherein the guides are attached to the partition wall.

17. The housing arrangement of claim 15, wherein the wiring connector unit further comprises a locking device for keeping the wiring connector unit in a position for connection to a circuit board, and the housing arrangement further comprises a holding device that cooperates with the locking device.

18. The housing arrangement of claim 17, wherein the holding device comprises a lateral edge of a connected circuit board.

19. The housing arrangement of claim 15, wherein the displacement direction in which a circuit board is displaced when being connected to the connection panel is substantially perpendicular to a large surface of the connection panel.

20. The housing arrangement of claim 15, wherein the wiring connector unit includes a bevelled edge.

21. A wiring connector unit for connecting a plurality of circuit boards to a connection panel, each circuit board having first connector contacts for connection to the connection panel and second connector contacts, the circuit board being displaced in a connecting direction towards the connection panel for connection thereto, the connection panel having electrically connected panel connector contacts for connection to the first connector contacts of each circuit board, the wiring connector unit comprising:

a body having a generally rectangular shape, including front edge surfaces and lateral edges;

third connector contacts located on a front edge surface for connection to the second connector contacts, the third connector contacts engaging the second connector contacts when the circuit board is connected to the connection panel;

fourth connector contacts for connection to external devices, the fourth connector contacts electrically connected to the third connector contacts, the lateral edges cooperating with guides to cause the unit to be displaced in generally the same direction as the connecting direction when being connected to the circuit board.

22. The wiring connector unit of claim 21, wherein the fourth connector contacts are located on a front edge surface.

23. The wiring connector unit of claim 21, wherein the fourth connector contacts are located on a front edge surface and are arranged in parallel to the front edge surface where the third connector contacts are located.

24. The wiring connector unit of claim 21, further comprising a recess at one corner of the generally rectangular shape, wherein a front edge surface is disposed in the recess and the third connector contacts are located on the front edge surface in the recess.

25. The wiring connector unit of claim 21, wherein the third connector contacts comprise contacts for connecting at least two circuit boards to the wiring connector unit.

26. The wiring connector unit of claim 21, further comprising a locking device for keeping the unit in a fixed position.

27. The wiring connector unit of claim 21, wherein the the third and fourth connector contacts are electrically connected through one or more of the following interface devices: filters, voltage conversion circuits, modulation circuits, and demodulation circuits.

28. The wiring connector unit of claim 21, wherein the wiring connector unit includes a bevelled edge.

* * * * *